United States Patent
Mazahreh et al.

(10) Patent No.: US 9,112,529 B1
(45) Date of Patent: Aug. 18, 2015

(54) METHOD AND SYSTEM FOR FORWARD ERROR CORRECTION OF INTERLEAVED-FORMATED DATA

(71) Applicant: Xilinx, Inc., San Jose, CA (US)

(72) Inventors: Raied N. Mazahreh, Sandy, UT (US); Raghavendar M. Rao, Austin, TX (US)

(73) Assignee: XILINX, INC., San Jose, CA (US)

( * ) Notice: Subject to any disclaimer, the term of this patent is extended or adjusted under 35 U.S.C. 154(b) by 316 days.

(21) Appl. No.: 13/672,367

(22) Filed: Nov. 8, 2012

(51) Int. Cl.
*H03M 13/00* (2006.01)
*H03M 13/27* (2006.01)
*H03M 13/05* (2006.01)

(52) U.S. Cl.
CPC ........................... *H03M 13/05* (2013.01)

(58) Field of Classification Search
None
See application file for complete search history.

(56) References Cited

U.S. PATENT DOCUMENTS

| | | | | |
|---|---|---|---|---|
| 8,751,910 | B2* | 6/2014 | Farhoodfar et al. | 714/782 |
| 2007/0094580 | A1* | 4/2007 | Livshitz | 714/779 |
| 2010/0166103 | A1* | 7/2010 | Harel et al. | 375/295 |
| 2014/0205029 | A1* | 7/2014 | Srinivasa et al. | 375/260 |

OTHER PUBLICATIONS

Jain, Yung-Yih. et al., "Iterative Hard-Decision Decoding of Braided BCH Codes for High-Speed Optical Communication", pp. 1-6, Dec. 9-13, 2013, IEEE GLOBECOM 2013,Global Communications Conference, Exhibition & Industry Forum, Atlanta, GA, USA.
U.S. Appl. No. 13/425,363, filed Mar. 20, 2012, Poh Meng Hwee, et al., Xilinx, Inc, San Jose, CA USA.
Feltstrom, A.J., et al., "Braided Block Codes," IEEE Transactions on Information Theory, vol. 55, Issue 6, pp. 2640-2658, Jun. 2009.
Lentmaier, M. et al., "Density evolution analysis of Protograph-based braided block codes on the erasure channel," In Proc. 8th Intern. ITG Conf. on Source and Channel Coding (SCC), pp. 1-6, Feb. 2010, Siegen, Germany.

* cited by examiner

*Primary Examiner* — Justin R Knapp
(74) *Attorney, Agent, or Firm* — LeRoy D. Maunu

(57) ABSTRACT

In one embodiment, a device is provided. The device includes a first formatting circuit configured to add zero padding bits to a received data block. An FEC encoder circuit is coupled to the first formatting circuit and is configured to determine parity bits for the data block at a first code rate. A second formatting circuit is coupled to the FEC encoder circuit and is configured to combine the parity bits with the data block and remove the zero padding bits to provide an FEC coded data block at a second code rate. The second code rate is less than the first code rate.

19 Claims, 12 Drawing Sheets

METHOD AND SYSTEM FOR FORWARD ERROR CORRECTION OF INTERLEAVED-FORMATED DATA

FIELD OF THE INVENTION

An embodiment generally relates to forward error correction.

BACKGROUND

In the design of communications systems, there is generally a compromise between bit error rate (BER) and transmission bit rate. Higher bit rates tend to have higher BERs. Forward error correction (FEC) is often used to detect and correct symbols of a data packet received in error without requiring retransmission. FEC coding adds redundancy to a message by encoding such a message prior to transmission. For FEC, some example error correction codes include Hamming, Bose-Chaudhuri-Hochquenghem (BCH), Reed-Solomon (RS), Viterbi, trellis, etc.

SUMMARY

In one embodiment, a device is provided. The device includes a first formatting circuit configured to add zero padding bits to a received data block. An FEC encoder circuit is coupled to the first formatting circuit and is configured to determine parity bits for the data block at a first code rate. A second formatting circuit is coupled to the FEC encoder circuit and is configured to combine the parity bits with the data block and remove the zero padding bits to provide an FEC coded data block at a second code rate. The second code rate is less than the first code rate.

In another embodiment, a circuit for forward error correction decoding is provided. The circuit includes a decoding pipeline including a plurality of decoding stages. Each decoding stage is configured to receive blocks of data symbols and FEC datagrams in an interleaved format. Each of a first set of the FEC datagrams corresponds to a respective row of the data symbols in a de-interleaved format and each of a second set of the FEC datagrams corresponds to a respective column of the data symbols in the de-interleaved format. Each decoding stage includes a first formatting circuit configured to format the data symbols in the interleaved format into a row-aligned format. Each row of the data symbols in the row-aligned format includes symbols equal to symbols in a corresponding row in the de-interleaved format.

Each decoding stage includes a row decoding circuit coupled to the first formatting circuit and configured to perform FEC decoding of the data symbols in the row-aligned format using the first set of FEC datagrams. Each decoding stage further includes a second formatting circuit coupled to the row decoding circuit and configured to format the data symbols in the row-aligned format into a column-aligned format. Each row of the data symbols in the column-aligned format includes symbols equal to symbols in a corresponding column in the de-interleaved format. Each decoding stage further includes a column decoding circuit coupled to the second formatting circuit and configured to perform FEC decoding of the data symbols in the column-aligned format using the second set of FEC datagrams. Each decoding stage also includes a third formatting circuit coupled to the column decoding circuit and configured to format the data symbols in the column-aligned format into the interleaved format.

In yet another embodiment, a method is provided for forward error correction (FEC) encoding. A first plurality of data symbols are received and a second plurality of symbols including zero padding bits are added to the first plurality of data symbols to form a data block. The data block is formatted into a de-interleaved format. A first set of datagrams are determined. The first set of datagrams includes a respective datagram for each row of symbols of the data block in the de-interleaved format. A second set of datagrams are determined. The second set of datagrams includes a respective datagram for each column of symbols of the data block in the de-interleaved format. The first and second sets of datagrams are added to the data block in the de-interleaved format to produce an FEC coded data block. The second plurality of symbols including the zero padding bits are removed from the FEC coded data block to produce a reduced size FEC coded data block. The reduced size FEC coded data block is formatted into an interleaved format.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which:

FIG. 1 shows a diagonal two-dimensional matrix of data symbols for braided FEC codes;

FIG. 2 shows the matrix of data symbols of FIG. 1 arranged in an interleaved format;

DETAILED DESCRIPTION OF THE DRAWINGS

Figure 3:
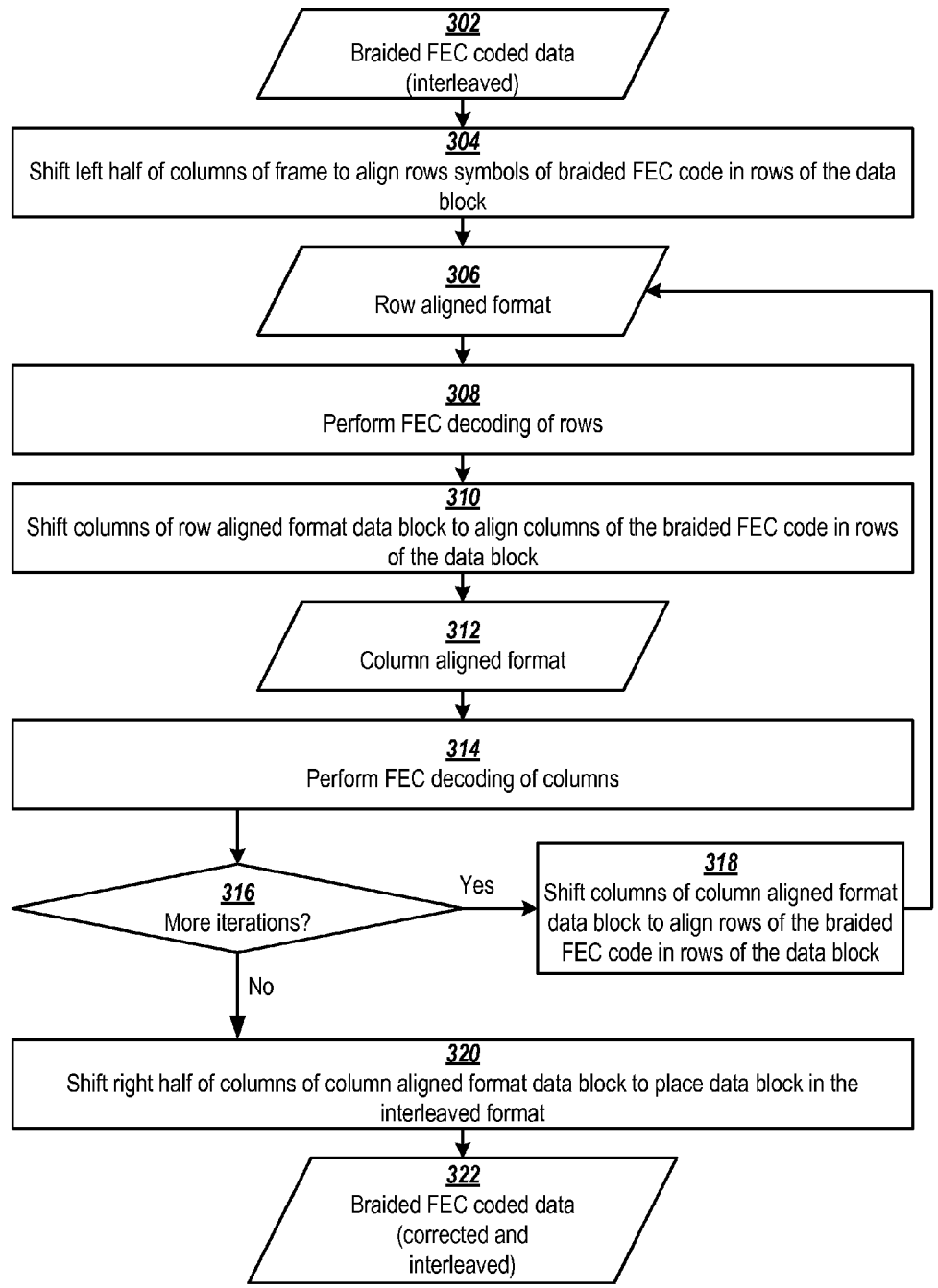
FIG. 3 shows a method for performing FEC decoding of a data block encoded with a braided FEC code.

Various methods and circuits are disclosed for FEC encoding and decoding using braided FEC codes. Braided FEC codes arrange data symbols into a diagonal two-dimensional array that may be extended indefinitely. Rows and columns of the diagonal array are each encoded to produce respective sets of parity bit information that may be used to recover data symbols that are lost or become corrupted in transmission. Data symbols are typically transmitted in a rectangular matrix format. Due to the unique shape of the diagonal two-dimensional arrays used by the braided FEC codes, symbols are interleaved and de-interleaved during the encoding, transmission, and decoding process. In the following discussion, various methods and systems are described for FEC coding and decoding that efficiently interleave and de-interleave data symbols in the encoding and decoding processes.

Figures 1, 2:
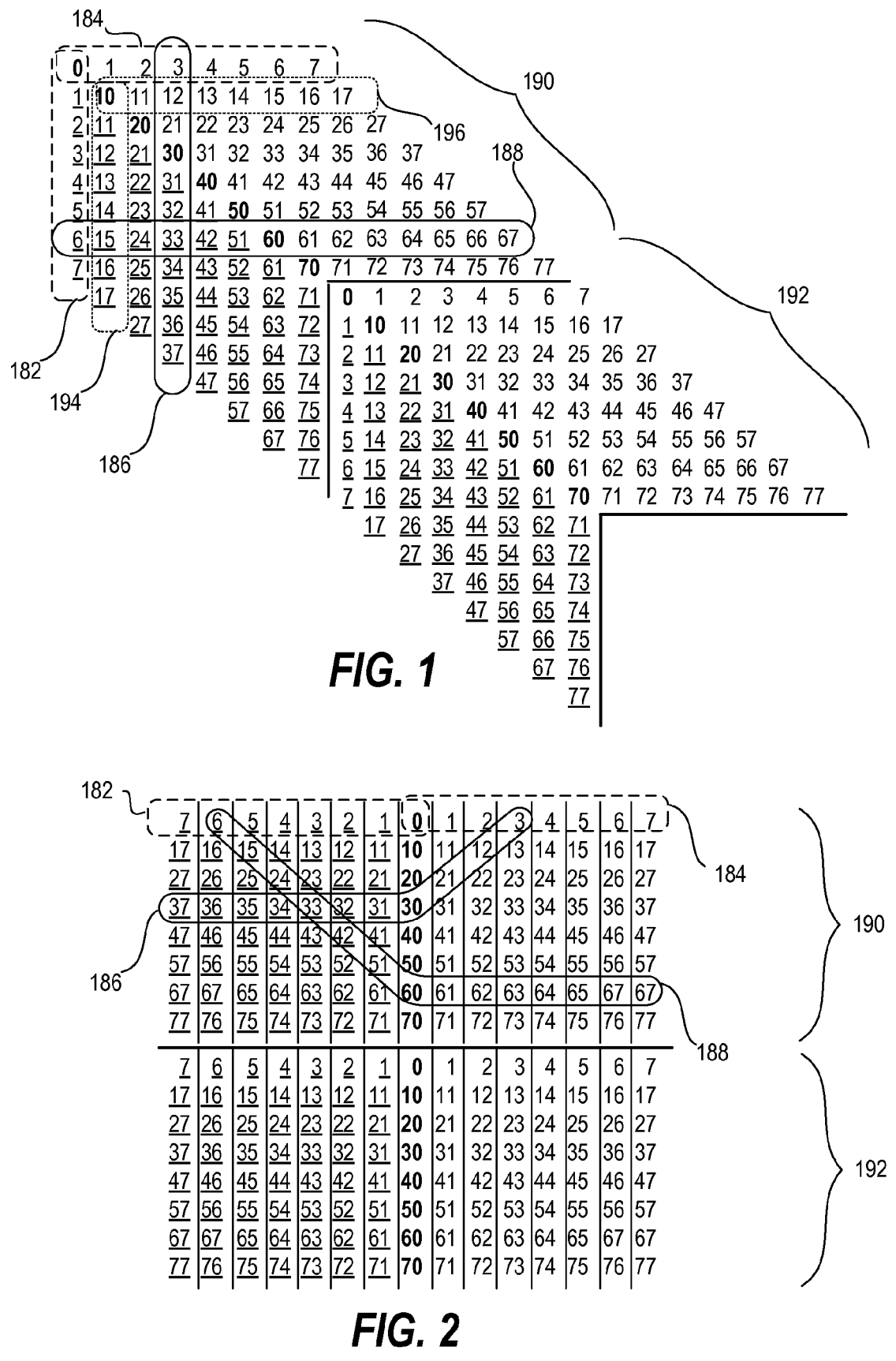

FIG. 1 shows a matrix of data symbols for an FEC braided block code. A braided block code arranges data symbols into a diagonal two-dimensional array that may be extended indefinitely. Data symbols are arranged into respective pairs of overlapping vertical and horizontal symbol segments (e.g., symbol segment pair 182 and 184 and segment pair 194 and 196), where a topmost symbol of the vertical segment is also included in the corresponding horizontal symbol segment. In this example, symbols in the vertical symbol segments are underlined, and symbols shared between vertical and horizontal segments are shown as bold. The segment pairs are arranged diagonally. Segment pairs are diagonally appended to form the diagonal matrix. For instance, the segment pair 194 and 196 is located diagonally below and to the right of the segment pair, which includes segments 182 and 184, having shared symbol 0. The diagonal matrix may be extended indefinitely to include multiple data blocks. For instance, in the example shown in FIG. 1, the diagonal matrix is extended to include two data blocks 190 and 192. For ease of reference, the diagonal matrix arrangement may be referred to as a de-interleaved format.

For each row and column (e.g., row 188 and column 186) of the de-interleaved format, a respective set of parity bits is generated that may be used to detect and/or recover from errors in the respective row or column. In the de-interleaved format, each data symbol is separately encoded in one row and one column. For example, a first set of parity bits is determined for column 186 and a second set of parity bits is generated for row 188. Respective sets of parity bits are also generated for each of the other rows and columns in the de-interleaved format. For ease of reference, the parity bits generated for a respective row or column may be referred to as an FEC datagram. FEC datagrams may be calculated for each row and column of symbols in the de-interleaved format using a number of coding algorithms including, for example, Hamming, RS, BCH, Viterbi, Trellis, XOR, etc. For ease of reference, examples are primarily described as having datagrams generated using BCH encoding. However, the examples may be modified to alternatively or additionally utilize other coding algorithms as well.

In performing FEC decoding of a block of data symbols after transmission, one or more symbols in a row or column may be corrected using a corresponding FEC datagram. The maximum number of symbols that may be corrected in a row or column depends on the coding algorithm used and the number of parity bits included in each FEC datagram. If a row includes more symbols in error than the maximum number of data symbols that can be corrected, correction cannot be performed using the corresponding row FEC datagram. However, even if a row contains more symbols in error than the maximum, some of the data symbols in error may be recovered in their columns using the column FEC datagrams. After recovering the one or more symbols using the column FEC datagrams, the number of data symbols in error in the row may be less than the maximum number. If so, the remaining data symbols in error in the row may be corrected using the corresponding row FEC datagram. By iteratively alternating between FEC decoding rows and FEC decoding columns, a larger number of missing data symbols may be recovered.

To facilitate transmission, columns of the symbols in the de-interleaved format may be shifted to arrange the symbols into a rectangular matrix used by most transport protocols. This shifting causes portions of the rows and columns of the data block in the de-interleaved format to become interleaved. For ease of reference, the rectangular matrix rearrangement of symbols from a de-interleaved data block (e.g., FIG. 1) may be referred to as an interleaved format. FIG. 2 shows the matrix of data symbols of FIG. 1 rearranged into an interleaved format. In the interleaved format, segments of each segment pair of the data blocks in the de-interleaved format shown in FIG. 1 are aligned in a respective row of the rectangular matrix. For instance, segments of the segment pair having vertical and horizontal segments 182 and 184 are aligned in the first row of the interleaved format shown in FIG. 2. In this alignment, rows and columns of the de-interleaved format (e.g., 188 and 186) become interleaved. For instance, symbols of column 186 of the braided FEC format are aligned in the fourth row in the left half of the interleaved format, but are interleaved in different rows (i.e., rows 1-3) in the right half of the interleaved format. Conversely, symbols of row 188 of the de-interleaved format are aligned in the seventh row in the right half of the interleaved format, but are interleaved in different rows (i.e., rows 1-6) in the left half of the interleaved format.

In the data blocks 190 and 192 shown in FIGS. 1 and 2, each of the vertical and horizontal segments (e.g., 182 and 184) includes seven symbols in addition to the shared symbol of the pair. As a result, the data block in the de-interleaved format and the interleaved format includes 15 columns (7*2+1). However, the embodiments are not so limited. Rather, the size of vertical and horizontal segments may be increased or decreased as required for different applications. For instance, for BCH (1023, 991) coding (1023 bit codewords having 991 data bits and 32 parity bits), a data block may be arranged into 3-bit symbols with 170 symbols in each of the vertical and horizontal segment in addition to the shared symbol ((170*2+1)*3=1023). For ease of illustration and explanation, interleaving and de-interleaving of the braided FEC data is primarily described with reference to one of the data blocks (e.g., 190) in the 15-column example shown in FIGS. 1 and 2.

In many communication systems, a receiver is generally configured to receive data in rectangular matrices, either one row or one column at a time. For ease of reference, the examples and embodiments are primarily described with reference to a communication system that receives data in the rectangular interleaved format one row at a time. Due to the interleaving of the rows and columns of the de-interleaved format when rearranged into the interleaved format described above, rows and/or columns must be de-interleaved before FEC can be performed using the parity bits to detect and/or correct errors in each row or column. Similarly, when encoding data to produce braided FEC coded data in the de-interleaved format (e.g., FIG. 1), data symbols to be encoded are generally received in a rectangular format, such as that shown in FIG. 2. The input rectangular data block must be rearranged to align rows and columns of the symbols of the de-interleaved format before FEC coding may be performed to determine parity bits for each row or column.

In the following discussion, various methods and systems are described for FEC coding and decoding, that efficiently convert data symbols between the interleaved format and other formats that align rows and columns of the de-interleaved format for FEC encoding or decoding. Rows and columns of the de-interleaved format are interleaved and de-interleaved by shifting columns of the symbols. For instance, in one application, an FEC decoder is configured to alternate between arranging data symbols (received in the interleaved format) between a row-aligned format and a column-aligned format for FEC decoding of rows and columns of the de-interleaved format. In the row-aligned format, the symbols are arranged such that symbols in each row correspond to a respective row of symbols in the de-interleaved format. When in the row-aligned format, rows of the row-aligned format (i.e., rows of the de-interleaved format) may be input to a first FEC decoder one at a time for performing FEC on rows of symbols in the de-interleaved format. In the column-aligned format, the symbols are arranged such that symbols in each row of symbols in the column aligned format correspond to a respective column of symbols in the de-interleaved format. When in the column-aligned format, rows of the column-aligned format (i.e., columns of the de-interleaved format) may be input to a second FEC decoder one at a time for performing FEC on columns of symbols in the de-interleaved format.

FIG. 3 shows a method for performing FEC decoding of a data block that is encoded with a braided FEC code. A frame of data 302, encoded with a braided FEC code, is received in the interleaved format. The left half of the columns in the frame are shifted at block 304 to align symbols into the row-aligned format 306. In the row-aligned format, rows of the symbols from the de-interleaved format are aligned in respective rows. Rows of the braided FEC format are FEC decoded using corresponding FEC datagrams at block 308. After FEC decoding rows, columns of the row-aligned format 306 are shifted at block 310 to rearrange symbols into the column-aligned format 312. In the column-aligned format 312, columns of symbols in the de-interleaved format are aligned in respective rows. Columns of the de-interleaved format are FEC decoded using corresponding FEC datagrams at block 314.

As described above, multiple iterations of row and column decoding may be performed to correct a larger number of data symbols in error. If more iterations are to be performed, decision block 316 directs the process to block 318, where columns of the column-aligned format 312 are shifted to rearrange symbols into the row-aligned format 306. Row decoding, shifting of blocks, and column decoding are then repeated as described above with reference to blocks 308, 310, 312 and 314. If no more decoding iterations are to be performed, the right half of columns of the column-aligned format 312 are shifted at block 320 to rearrange the corrected symbols back into the interleaved format 322.

Figure 4:
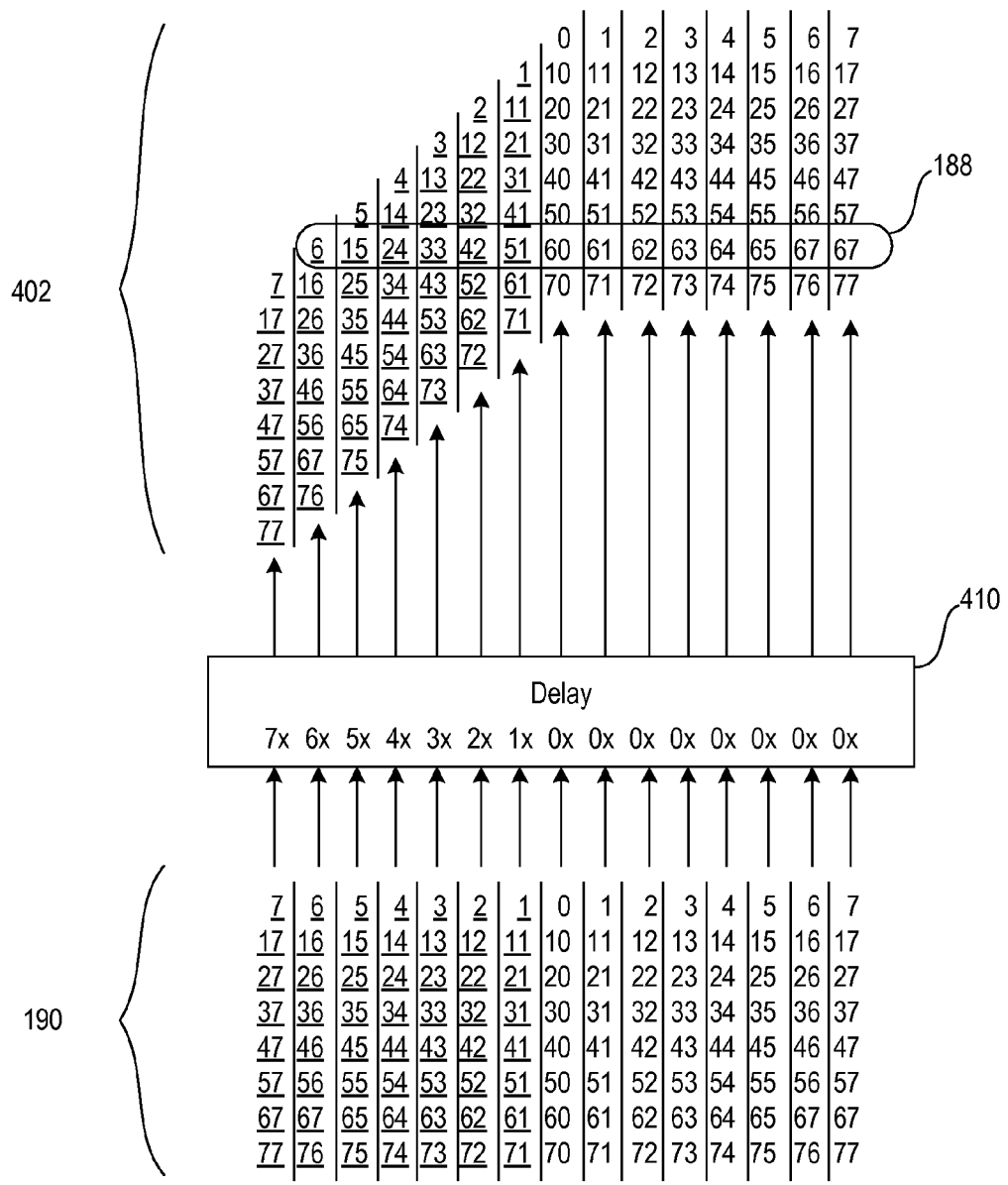
FIG. 4 illustrates shifting columns of data symbols from an interleaved data format to into a row-aligned format.

FIG. 4 illustrates shifting columns of symbols from an interleaved format into a row-aligned format. In this example, the symbols of data block 190 in the interleaved format shown in FIG. 2 are rearranged to place the symbols into the row-aligned format 402. As described with reference to block 304 in FIG. 3, the left half of the columns in the interleaved format 190 are shifted to arrange the symbols into the row-aligned format 402. For instance, the symbols from the interleaved format that comprise row 188 of the de-interleaved format shown in FIG. 1, are aligned in the seventh row of the row-aligned format 402.

As indicated above, the rows of symbols of the interleaved format are received one at a time with symbols of each row of the interleaved format being received in parallel. For instance, the top row of the symbols in the interleaved format 190 may be received in parallel at time t0 and the second row may be received in parallel at time t1. In this example, columns are shifted by delaying symbols, corresponding to different columns, by different amounts of delay as rows are received. A delay circuit 410 delays symbols of the different columns. In this 15-column example, the leftmost seven columns are delayed by units of delay 7x, 6x, 5x, 4x, 3x, 2x, and 1x, respectively (x connotes a unit of delay equal the number of bits in 1 symbol). The rightmost seven columns and the center column are not delayed (0x units of delay). In general, for a block of symbols in the interleaved format having L columns, the (L−1)/2 leftmost columns are each delayed by a respective number of delay units equal to a difference between an index of the column and an index of the center column (L+1)/2. As a result of the delays, the columns are shifted to place the symbols into the row-aligned format 402.

Figure 5:
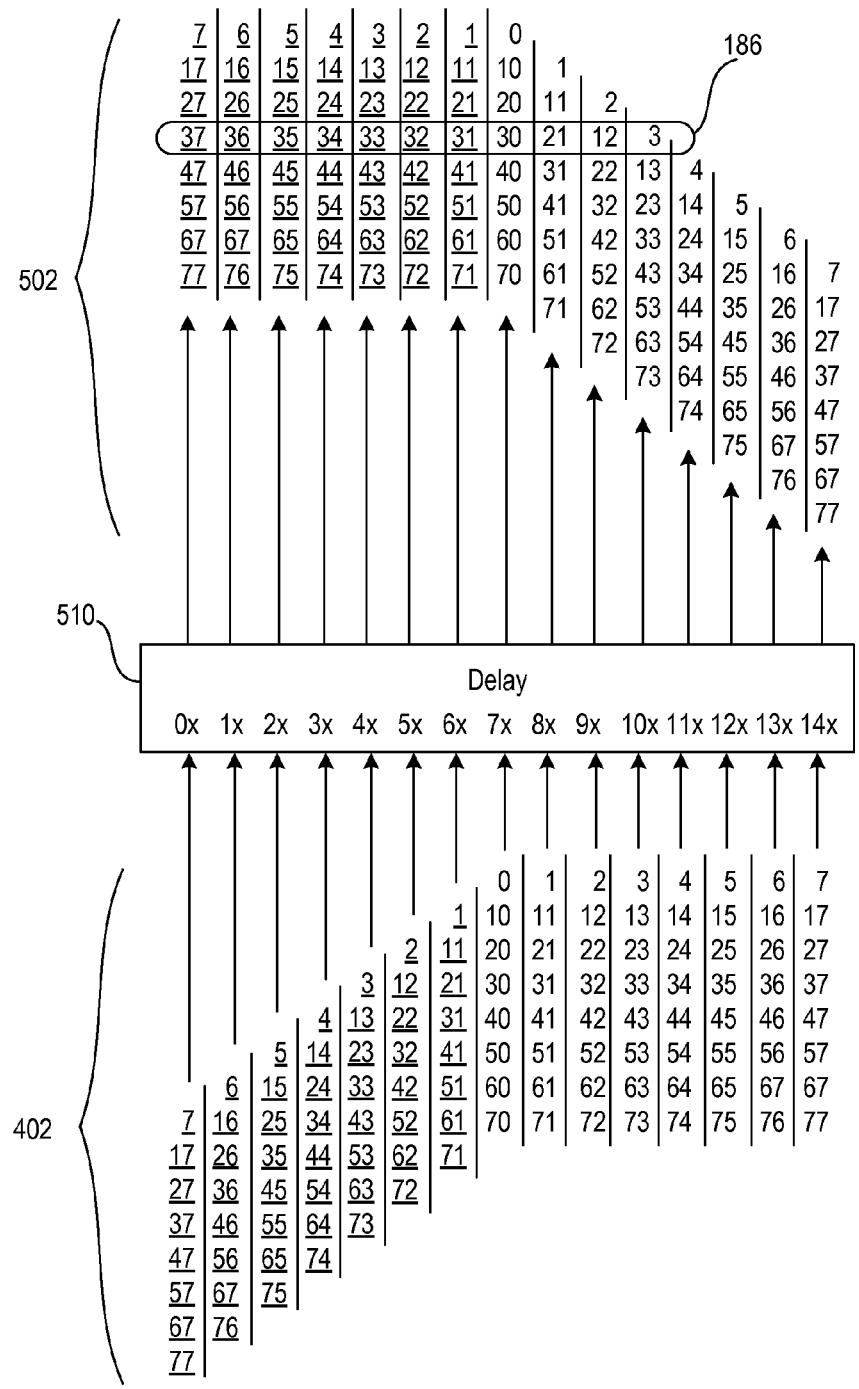
FIG. 5 illustrates shifting columns of data symbols from the row-aligned format into a column-aligned format.

FIG. 5 illustrates shifting columns of symbols in the row-aligned format to place the symbols into a column-aligned format. In this example, the symbols in the row-aligned format 402 shown in FIG. 4 are rearranged to place the symbols into the column-aligned format 502. As described with reference to block 310 in FIG. 3, the columns of the symbols in the row-aligned format 402 are shifted to arrange the symbols into the row-aligned format 502. For instance, symbols of column 186 in the de-interleaved format shown in FIG. 1 are aligned in the fourth row of the column-aligned format 502.

As described with reference to FIG. 4, columns are shifted by delaying symbols, corresponding to different columns by different amounts of delay as rows of the row-aligned format 402 are received. A delay circuit 510 delays symbols of the different columns. In this 15-column example, the columns are delayed by respective numbers of delay units 0x through 14x from the leftmost column to the rightmost column. In general, for a block of symbols in the interleaved format having L columns, each column is delayed by a respective number of delay units equal to an index of the column (0 to L−1 from the leftmost column to the rightmost). As a result of the delays, the columns are shifted to place the symbols into the column-aligned format 502.

Figure 6:
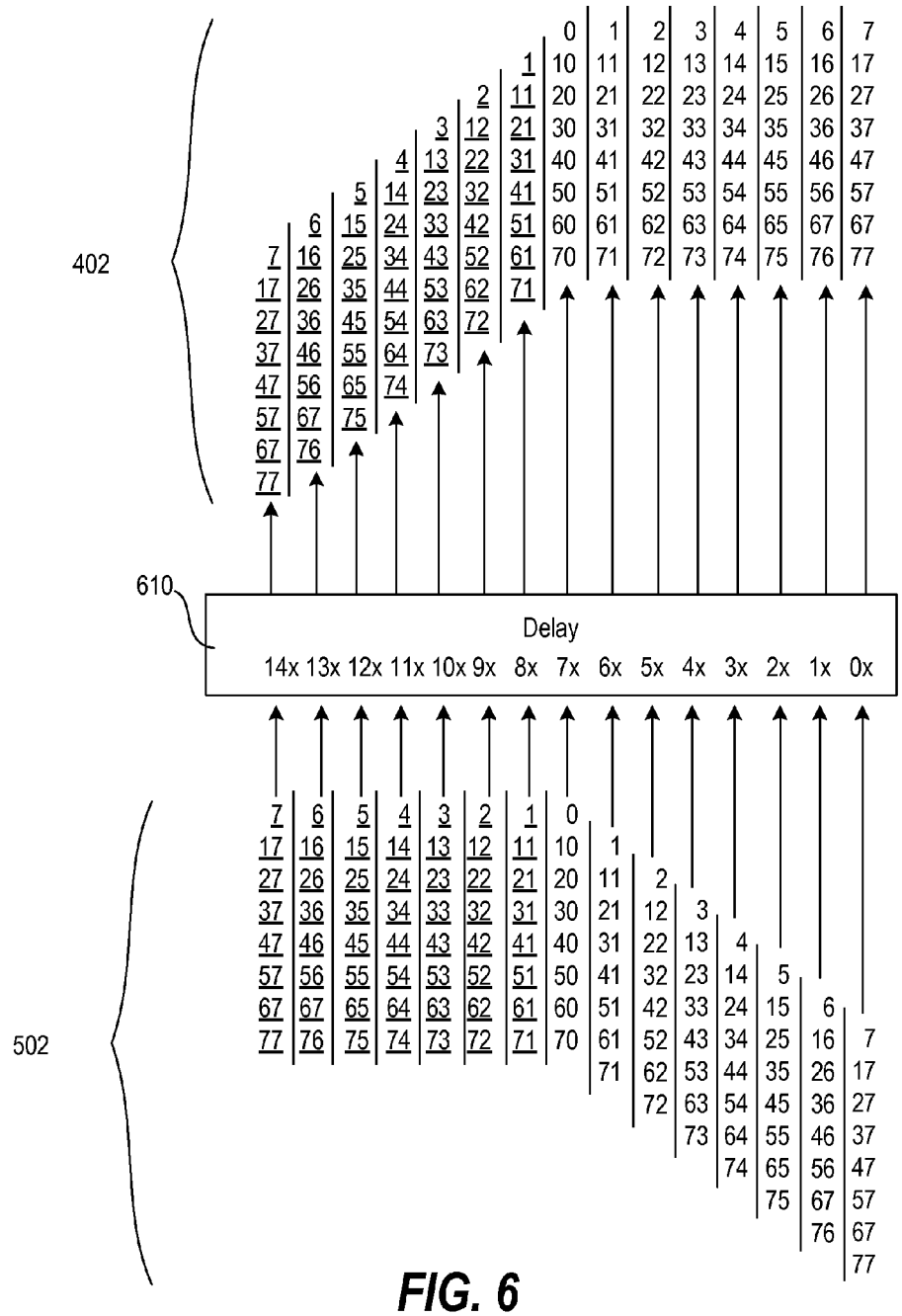
FIG. 6 illustrates shifting columns of data symbols from the column-aligned format into the row-aligned format.

FIG. 6 illustrates shifting columns of symbols in the column-aligned format to place the symbols in the row-aligned format. In this example, the symbols in the column-aligned format 502 shown in FIG. 5 are rearranged to place the symbols back into the row-aligned format 402 shown in FIG. 4. As described with reference to block 318 in FIG. 3, the columns of the symbols in the column-aligned format 502 are shifted to arrange the symbols into the row-aligned format 402.

As described above, columns are shifted by delaying symbols, corresponding to different columns by different amounts of delay as rows of the column-aligned format 502 are received. A delay circuit 610 delays symbols of the different columns. In this 15-column example, the columns are delayed by respective numbers of delay units 14x through 0x (from the leftmost column to the rightmost column). In general, for a block of symbols in the interleaved format having L columns, each column is delayed by a respective number of delay units equal to (L−1)−M, wherein M is an index of the column (0 to L−1, from the leftmost column to the rightmost). As a result of the delays, the columns are shifted to place the symbols back into the row-aligned format 502.

Figure 7:
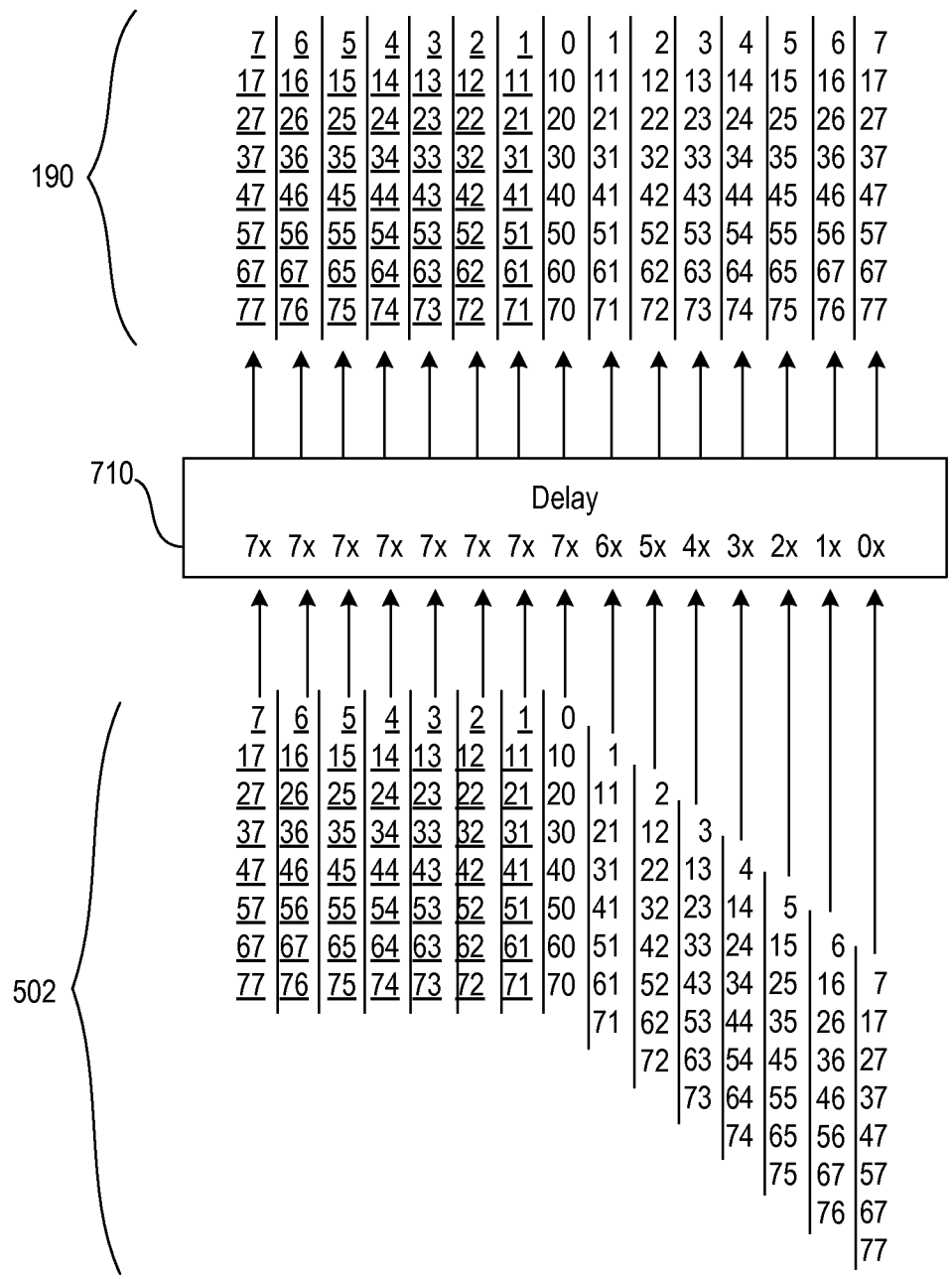
FIG. 7 illustrates shifting columns of data symbols from the column-aligned format into the interleaved format.

FIG. 7 illustrates shifting columns of symbols in the column-aligned format to place the symbols in the interleaved format. In this example, the symbols in the column-aligned format 502 shown in FIG. 5 are rearranged to place the symbols back into the interleaved format 190 shown in FIG. 4. As described with reference to block 320 in FIG. 3, the columns of the symbols in the column-aligned format 502 are shifted to arrange the symbols into the interleaved format 190.

As described above, columns are shifted by delaying symbols, corresponding to different columns by different amounts of delay as rows of the column-aligned format 502 are received. A delay circuit 710 delays symbols of the different columns. In this 15 column example, the leftmost eight columns are each delayed by 7x delay units. The rightmost seven columns are delayed by respective delay amounts 6x, 5x, 4x, 3x, 2x, 1x, and 0x. In general, for a block of symbols in the interleaved format having L columns, the (L+1)/2 leftmost columns are each delayed by (L−1)/2 delay units. The (L−1)/2 rightmost columns are each delayed by a respective number of delay units equal to L−M, where M is the index of the column. As a result of the delays, the columns are shifted to place the symbols back into the interleaved format 190.

As indicated above, in some applications, decoding of rows and columns of symbols of the de-interleaved format may be repeated—alternating between decoding rows of symbols of the de-interleaved format and decoding columns of symbols of the de-interleaved format by placing the symbols into the row-aligned and column-aligned formats. In some implementations, FEC decoding may be performed in a pipeline, with each stage in the pipeline performing one iteration of row decoding and column decoding.

Figure 8:
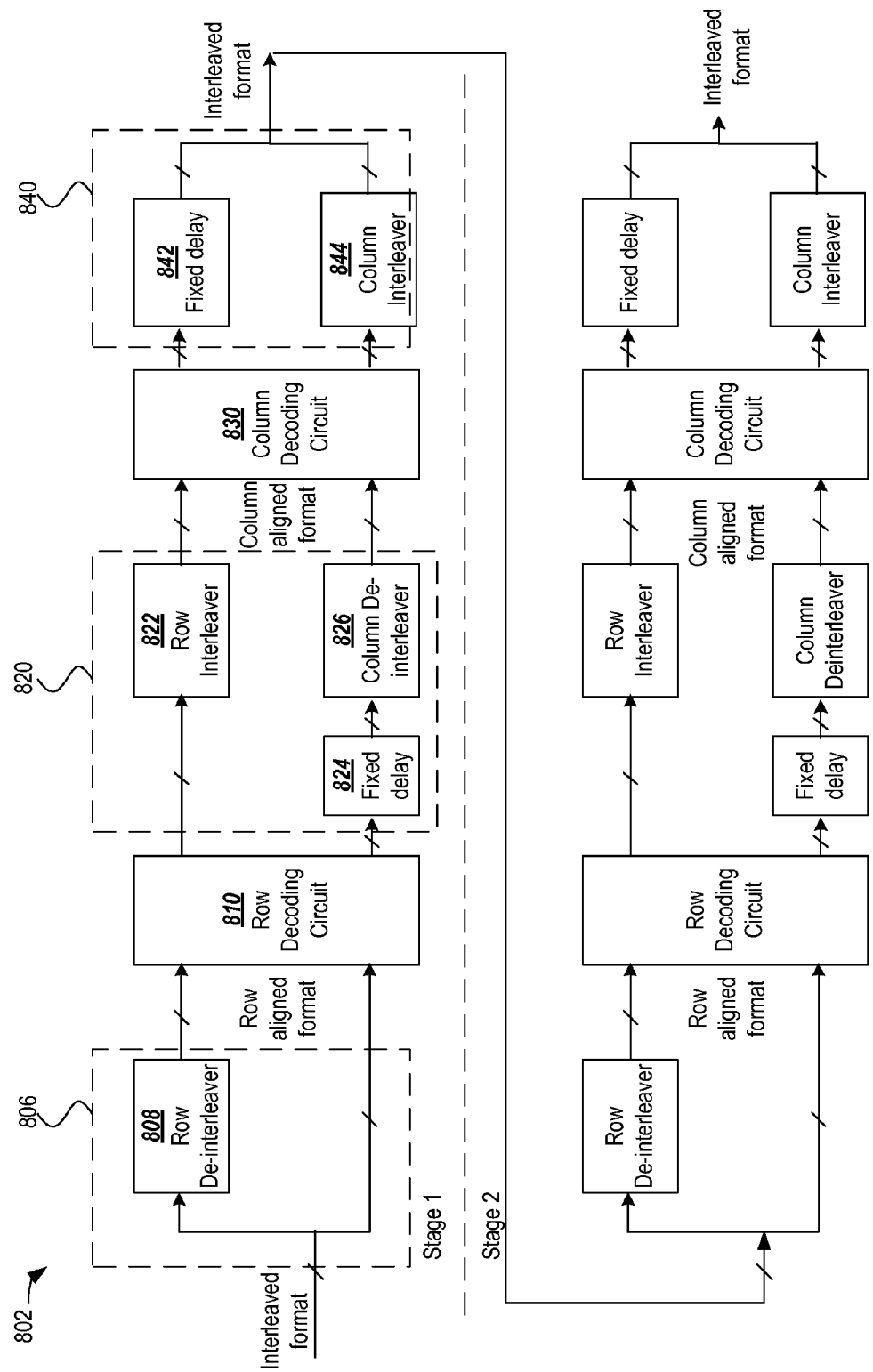
FIG. 8 shows two stages of a pipeline for decoding braided FEC coded symbols.

FIG. 8 shows two stages of a pipeline for decoding braided FEC coded symbols. In this example, two decoding stages 802 and 804 are connected in series to perform two iterations of alternating row and column decoding. However, the pipeline may be implemented using other numbers of decoding stages as well. Each decoding stage (e.g., 802) includes a first formatting circuit 806 configured to receive the braided FEC coded symbols in the interleaved format having L columns and rearrange the symbols into the row-aligned format. In this example, the first formatting circuit includes a row de-interleaver circuit 808 configured to delay the leftmost (L−1)/2 columns of the symbols in the interleaved format as described with reference to FIG. 4.

Each decoding stage includes a row decoding circuit 810 coupled to receive the braided FEC coded symbols in the row-aligned format from the first formatting circuit 806. The row decoder is configured to perform FEC decoding of the rows of the data symbols in the row-aligned format (i.e., rows of the de-interleaved format) using respective FEC datagrams.

Each decoding stage includes a second formatting circuit 820 coupled to receive the corrected symbols in the row-aligned format from the row decoding circuit 810 and configured to place the symbols into the column-aligned format. As described with reference to FIG. 5, data symbols in the row-aligned format may be rearranged into the column-aligned format by delaying symbols in each column by a number of delay units equal to an index of the column (0 to L−1 from the leftmost column to the rightmost column).

In this example, the second formatting circuit includes a row interleaver circuit 822 configured to delay each of the (L−1)/2 leftmost columns by a number of delay units equal to an index of the column (0 to L−1 from the leftmost column to the rightmost column). The second formatting circuit also includes a fixed delay circuit 824 and a column de-interleaver circuit 826, which together are configured to delay each of the (L−1)/2 rightmost columns by a number of delay units equal to an index of the column. The fixed delay circuit 824 delays each of the (L+1)/2 rightmost columns by (L−1)/2 delay units. The column de-interleaver circuit 826 further delays each of the (L+1)/2 rightmost columns by a number of delay units equal to an index of the column (M) minus (L−1)/2.

Each decoding stage also includes a column decoding circuit 830 coupled to receive the symbols in the column-aligned format from the second formatting circuit 820. The column decoding circuit 830 is configured to perform FEC decoding on the rows of the data symbols in the column-aligned format (i.e., columns of the de-interleaved format) using respective FEC datagrams.

Each decoding stage includes a third formatting circuit 840 coupled to receive the corrected symbols in the column-aligned format from the column decoding circuit 830 and configured to place the symbols into the interleaved format. As described with reference to FIG. 7, symbols in the column-aligned format may be placed in the interleaved format by delaying the (L+1)/2 leftmost columns by (L−1)/2 delay units and delaying the (L−1)/2 rightmost columns by a respective number of delay units equal to L−M, where M is the index of the column.

In this example, the third formatting circuit 840 includes a fixed delay circuit 842 configured to delay each of the (L+1)/2 leftmost columns of the corrected symbols in the column-aligned format by (L−1)/2 delay units. The third formatting circuit 840 also includes a column interleaver circuit 844 configured to delay each of the (L−1)/2 rightmost columns by a respective number of delay units equal to M−((L−1)/2).

In some embodiments, the first, second, or third formatting circuits (806, 820, and 840) may be implemented with additional delay. For instance, the row interleaver 822, fixed delay circuit 824, and a column de-interleaver circuit 826 of the second formatting circuit 820 may be configured to further delay each column by an additional delay unit.

Figure 9:
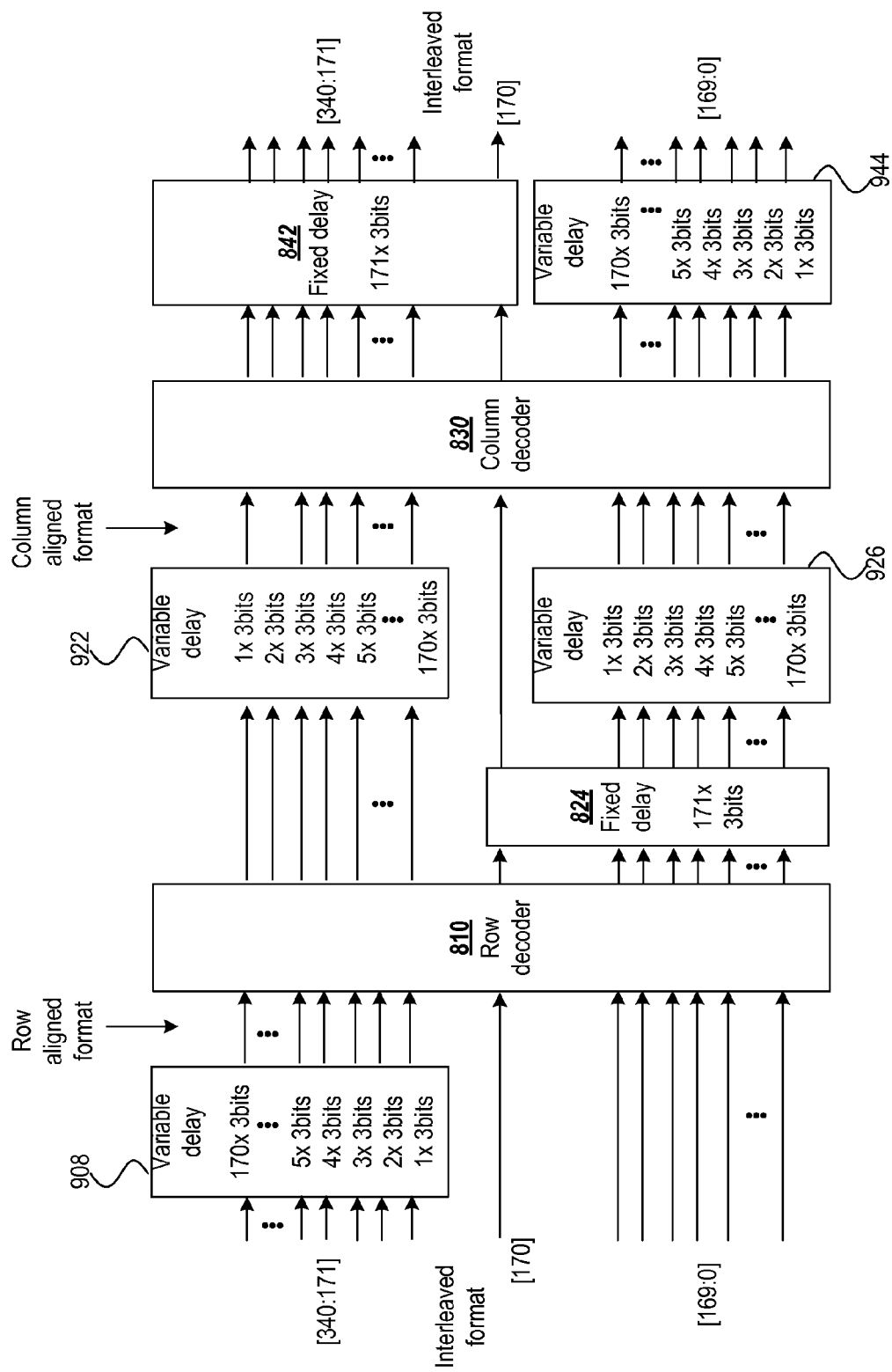
FIG. 9 shows one stage of the decoder pipeline of FIG. 8 having delays configured to shift columns of symbols as illustrated in FIGS. 4-7.

In one implementation, the decoder pipeline is configured to decode a braided FEC data block having rows and columns of symbols encoded with BCH (1023, 991) coding (having 1023-bit codewords with 991 data bits and 32 parity bits). FIG. 9 shows one stage of the decoder pipeline of FIG. 8 having delays configured to decode row and columns encoded with BCH (1023, 991) coding. In this example, the decoding stage is configured to receive a braided FEC data in the interleaved format having 341 columns of 3-bit symbols (341*3=1023). The decoder is configured to receive a row of the symbols in the interleaved format over a [340:0] bit data channel (1-bit for each of the 341 columns) every three data input cycles. In this manner, a 1023 bit codeword is received over the [340:0] bit data channel in three cycles. In this example, the row de-interleaver circuit 808 is implemented with a variable delay circuit 908 that is configured to delay symbols received on the leftmost 340 to 171 bits by respective delay units from 170x to 1x. In this example, each delay unit is equal to 3 clock cycles since each symbol includes 3-bits and is received over 3 clock cycles.

The row interleaver circuit 822 is implemented with a variable delay circuit 922 configured to delay symbols received on the leftmost 340 to 171 bits by respective numbers of delay units 1x to 170x. The fixed delay circuit 824 is configured to delay each of the rightmost 170 to 0 bits by 171x delay units. The column de-interleaver circuit 826 is implemented with a variable delay circuit 926 configured to further delay symbols received on the rightmost 169 to 0 bits by respective numbers of delay units 1x to 170x. The fixed delay circuit 842 is configured to delay each of the leftmost 340 to 170 bits by 171x delay units. The column interleaver circuit 844 is implemented with a variable delay circuit 944 configured to delay symbols received on the rightmost 169 to 0 bits by respective numbers of delay units from 170x to 1x.

In some applications, the above braided FEC coding may be used to facilitate FEC for data transmitted over a high-speed optical transport network (OTN). In OTN networks payload is transported within optical transport unit (OTU) frames of 4*4080 bytes. 4*3824 bytes of the OTU frame are used to transport information payload and 4*256 bytes of the OTU frame are reserved for FEC parity-bit information. The OTU frame format provides an FEC coding rate (ratio of payload bits to parity bits) of 3824/4080 (~0.9372549). The braided BCH (1023, 991) code discussed above includes 32 parity bits for each horizontal segment of data symbols and 32 parity bits for each vertical segment of data symbols. As a result, in contrast to the OTU frame, the braided BCH coding has an FEC code rate of (1023−32−32)/1023 (~0.9374389), which is greater than the OTU FEC coding rate. If FEC coding rates of the OTU frame and the FEC code algorithm are mismatched, rate matching circuitry is needed to segment and encode data blocks to achieve the OTU code rate.

In some implementations of the described methods and systems for FEC coding and decoding, an FEC encoder is configured to adjust coding rate of the FEC code. For instance, in one implementation, the encoder is configured to utilize the braided BCH (1023, 991) code with coding rate reduced to match that of the OTU frame, which has a lower coding rate. As such, the need for additional rate matching circuitry is mitigated. This saves significant amount of resources and latency at both the encoder and subsequent decoder. In one particular implementation, the payload of each of the braided BCH codewords is reduced to 1020 bits. As a result, the code rate of the braided BCH code becomes (1020−32−32)/1020 (~0.9372549), which is equal to that of the OTU frame. For ease of reference, the braided BCH coding with reduced payload may be referred to as the reduced braided coding.

The reduced braided coding may be implemented by reserving the center 3-bit symbol of each vertical and horizontal segment pair in the de-interleaved format with zero padding bits (e.g., zero bits) rather than payload. As a result, the payload of each codeword is reduced from 1023 bits to 1020 bits as needed to implement the reduced braided coding.

Figure 10:
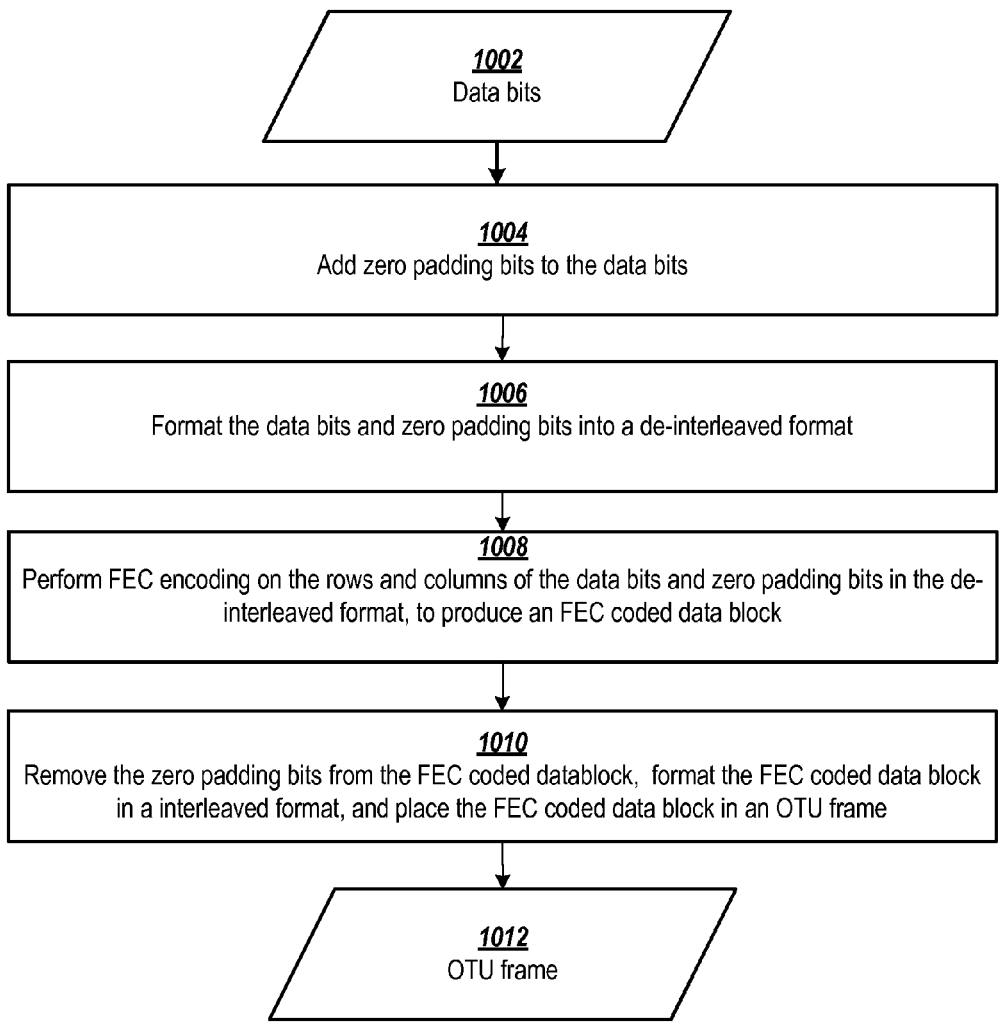
FIG. 10 shows a method for producing FEC coded data at a first coding rate using an FEC block coding method that operates at a second coding rate that is higher than the first coding rate.

For ease of reference, the examples of reducing the coding rate of FEC codes are primarily described with reference to the braided BCH coding having each codeword coded using BCH (1023, 991) code. However, the disclosed methods and systems may be adapted to utilize and adjust coding rate of other FEC codes as well. FIG. 10 shows a method for producing FEC coded data having a first FEC coding rate using a FEC block coding method having a second FEC coding rate that is higher than the first FEC coding rate. Zero padding bits are added to a set of received data bits 1002 at block 1004. The data bits and the zero padding bits are rearranged into a braided FEC format at block 1006. FEC encoding is performed on respective rows and columns of the data bits and zero padding bits in the braided FEC format at block 1008 to produce a braided FEC coded data block. After FEC coding, the zero padding bits from the braided FEC coded data block are removed at block 1010, and symbols of the FEC coded data block are rearranged into the interleaved format. The FEC coded data block may then be transported in an OTU frame 1012.

Figure 11:
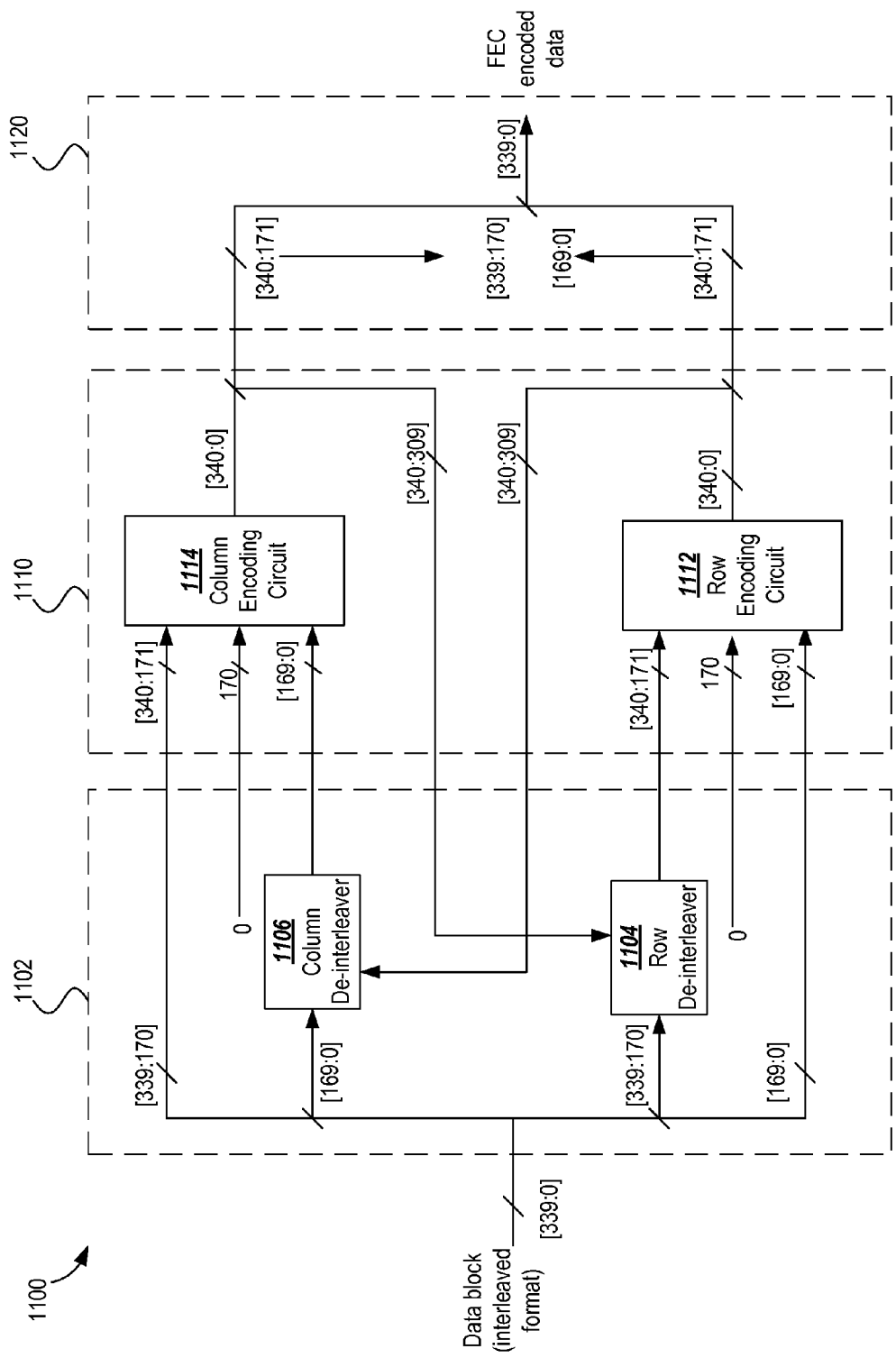
FIG. 11 shows an encoding circuit for FEC braided BCH encoding.

FIG. 11 shows an encoding circuit for FEC braided BCH encoding. In this example, the encoding circuit is configured to receive a data symbols in a rectangular matrix format. The data symbols in the rectangular matrix format are arranged as the data symbols in the interleaved format. In this example, the encoding circuit is configured to receive 3-bit data symbols arranged in 340 columns. The encoder circuit 1100 is configured to receive one row of the symbols in the interleaved format over a 339:0 bit data channel (1-bit for each of the 340 columns) every three data input cycles.

The encoder 1100 includes a first formatting stage 1102 configured to arrange the received data symbols into each of the row-aligned and column-aligned formats with zero padding bits added in the center symbols (170). As described above, the addition of the zero padding bits allows rows and columns of the data symbols to be encoded with BCH (1023, 991) encoding with the coding rate being reduced to match that used by OTU frames.

In this example, the first formatting stage 1102 includes a row de-interleaver circuit 1104 configured to shift the left half of the received bits ([339:170]) to arrange the symbols in these columns into the row-aligned format. The shifted bits ([339:170]) are combined with the zero padding bits and received bits ([169:0]) to place the received data symbols in the row-aligned format. The first formatting stage 1102 also includes a column de-interleaver circuit 1106 configured to shift the right half of the received bits ([169:0]) to arrange the symbols in these columns into the column-aligned format. The shifted bits ([169:0]) are combined with the zero padding bits and received bits ([339:170]) to place the received data symbols into the column-aligned format.

The encoding circuit 1100 includes a encoding stage 1110 configured to perform BCH encoding of rows of the row-aligned format and BCH encoding of columns of the column-aligned format in parallel. The encoding stage 1110 includes a row encoding circuit 1112 configured to encode rows of the row-aligned format (i.e., rows of the de-interleaved format) with BCH (1023, 991) coding. The encoding stage 1110 also includes a column encoding circuit 1114 configured to encode rows of the column-aligned format (i.e., columns of the de-interleaved format) with BCH (1023, 991) coding. The encoding stage is configured to feedback the generated parity bits from the row encoding circuit 1112 to the column de-interleaver 1106 to be incorporated into column encoding of subsequent columns of the de-interleaved format. The encoding stage is also configured to feedback the generated parity bits from the column encoding circuit 1114 to the row de-interleaver 1104 to be incorporated into row encoding of subsequent rows of the de-interleaved format.

The encoder 1100 includes a second formatting stage 1120 configured to merge the parity bits and data symbols output from the row encoding circuit 1112 and the column encoding circuit 1114 to produce a braided FEC coded data block in the interleaved format. The second formatting stage 1120 is configured to remove the zero padding bits from the braided FEC coded data block to reduce the block size back to 340 bits and produce data coded with the reduced braided coding. As a result, the coding rate is (1020−32−32)/1020 (~0.9372549), which is equal to that of the OTU frame.

Figure 12:
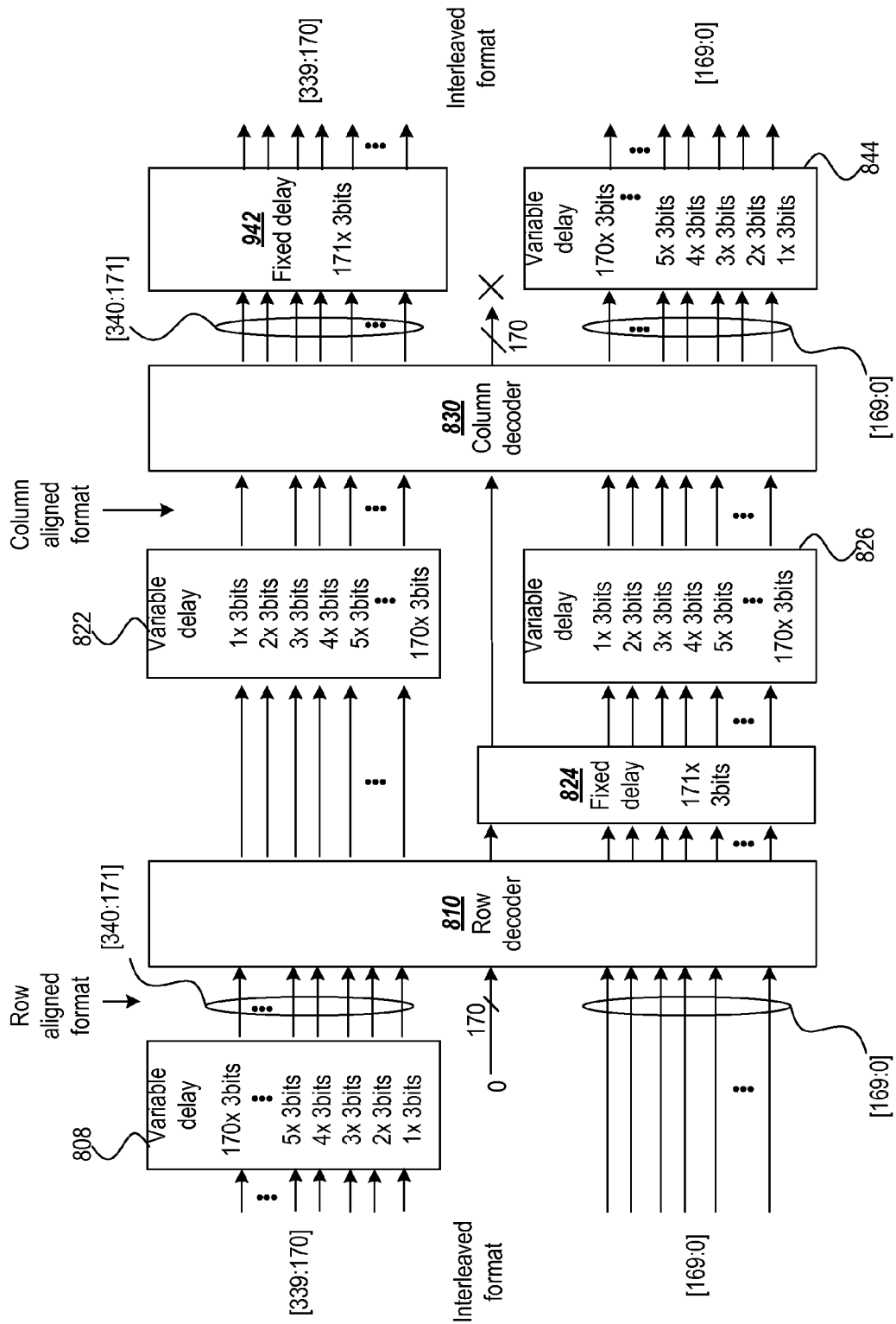
FIG. 12 shows the decoding circuit of FIG. 9 configured to decode braided FEC coded data generated by the encoding circuit of FIG. 11.

FEC can be performed on reduced braided coding with slight modification to the decoding methods and circuits described above. For instance, in one implementation, a decoder is configured to reformat reduced braided coded symbols to add zero padding bits to the center bit in each row of the received symbols in the interleaved format. Row and column FEC decoding is then performed as described with reference to FIGS. 3-9. After FEC decoding, the zero padding bits are removed from the corrected data. For instance, FIG. 12 shows the decoding circuit example in FIG. 9 configured to insert zero padding bits into received data blocks coded with the reduced braided coding. In this example, the delay and encoding circuits are primarily implemented in the same manner as that described with reference to FIG. 9. The left half of the received bits ([339:170]) is input to variable delay circuit 808. Received bits ([169:0]) are provided to inputs ([169:0]) of the row decoding circuit 810. A zero padding bit is provided to input (170) of the row decoding circuit 810. Outputs of the variable delay circuit 808 are provided to inputs ([340:171]) of the row decoding circuit 810. The row and column remaining circuits of the decoding circuit are the same as that discussed with reference to FIG. 9, except the delays performed after column decoding to place the symbols into the interleaved format. In this example, bit (170) output from column decoder circuit is discarded and is not delayed by fixed delay circuit 942. Output bits ([169:0]) are provided by the variable delay circuit 844 and output bits ([339:170]) are provided by the fixed delay circuit 942.

Figure 13:
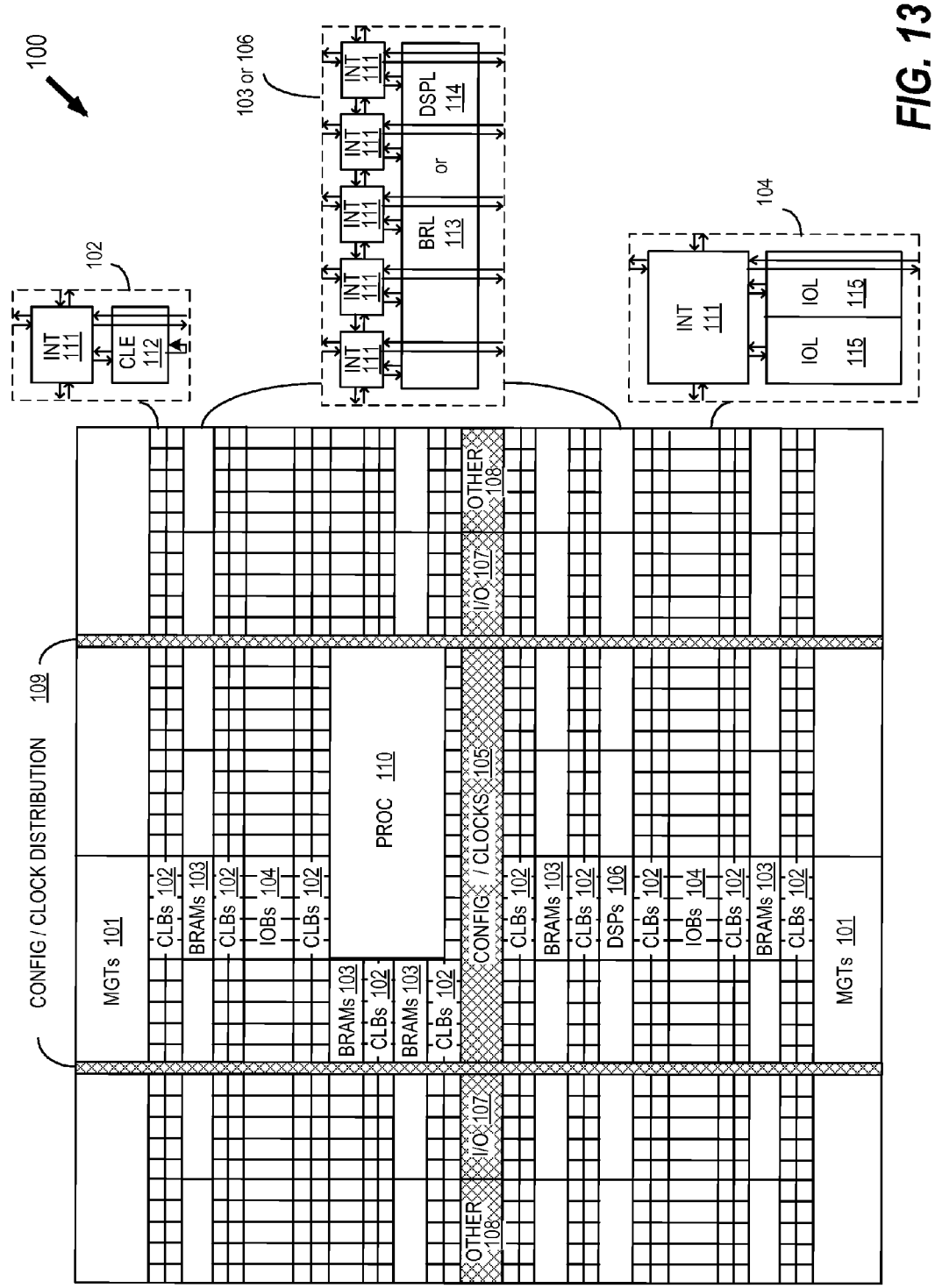
FIG. 13 shows a programmable integrated circuit (IC) that may be used in implementing an FEC encoder or decoder in accordance with various disclosed embodiments.

FIG. 13 is a block diagram of an example programmable logic integrated circuit that may be used in implementing an FEC encoder or decoder in accordance with various disclosed embodiments. An FEC encoder or decoder, as previously described, may be implemented on the programmable logic and interconnect resources of a programmable integrated circuit.

FPGAs can include several different types of programmable logic blocks in the array. For example, FIG. 13 illustrates an FPGA architecture (100) that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107), for example, e.g., clock ports, and other programmable logic 108 such as digital clock managers, analog-to-digital converters, system monitoring logic, and so forth. Some FPGAs also include dedicated processor blocks (PROC 110) and internal and external reconfiguration ports (not shown).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element INT 111 also includes the connections to and from the programmable logic element within the same tile, as shown by the examples included at the top of FIG. 13.

For example, a CLB 102 can include a configurable logic element CLE 112 that can be programmed to implement user logic plus a single programmable interconnect element INT 111. A BRAM 103 can include a BRAM logic element (BRL 113) in addition to one or more programmable interconnect elements. Typically, the number of interconnect elements included in a tile depends on the height of the tile. In the pictured FPGA, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element INT 111. As will be clear to those of skill in the art, the actual I/O pads connected, for example, to the I/O logic element 115 are manufactured using metal layered above the various illustrated logic blocks, and typically are not confined to the area of the input/output logic element 115.

In the pictured FPGA, a columnar area near the center of the die (shown shaded in FIG. 13) is used for configuration, clock, and other control logic. Horizontal areas 109 extending from this column are used to distribute the clocks and configuration signals across the breadth of the FPGA.

Some FPGAs utilizing the architecture illustrated in FIG. 13 include additional logic blocks that disrupt the regular columnar structure making up a large part of the FPGA. The additional logic blocks can be programmable blocks and/or dedicated logic. For example, the processor block PROC 110 shown in FIG. 13 spans several columns of CLBs and BRAMs.

Note that FIG. 13 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 13 are purely exemplary. For example, in an actual FPGA more than one adjacent column of CLBs is typically included wherever the CLBs appear, to facilitate the efficient implementation of user logic.

The disclosed embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A device, comprising:
   a first formatting circuit configured to add zero padding bits to a received data block;
   a forward error correction (FEC) encoder circuit coupled to the first formatting circuit and configured to determine parity bits for the data block at a first code rate; and
   a second formatting circuit coupled to the FEC encoder circuit and configured to combine the parity bits with the data block and remove the zero padding bits to provide an FEC coded data block at a second code rate, the second code rate being less than the first code rate;
   wherein the first formatting circuit includes:
      a row de-interleaver circuit configured to format the received data block into a row-aligned format, wherein each row of the data block in the row-aligned format includes data bits equal to data bits in a corresponding row in a de-interleaved format; and
      a column de-interleaver circuit configured to format the received data block into a column-aligned format, wherein each row of the data block in the column-aligned format includes data bits equal to data bits in a corresponding column in the de-interleaved format;
   the FEC encoder circuit includes:
      a row encoding circuit coupled to the first formatting circuit and configured to perform FEC coding on the rows of the data block in the row-aligned format to produce a row-coded data block; and
      a column encoding circuit coupled to the second formatting circuit and configured to perform FEC coding on rows of the data block in the column-aligned format, the rows corresponding to respective columns of the data block in the de-interleaved format, to produce a column-coded data block; and
   the second formatting circuit is configured to combine the row-coded data block and the column-coded data block to produce an FEC coded data block and remove the zero padding bits.

2. The device of claim 1, wherein a ratio of data bits to parity bits in the FEC coded data block is 956 to 64.

3. The device of claim 2, wherein a ratio of data bits to zero padding bits in the FEC coded data block is 956 to 3.

4. The device of claim 1, wherein the first formatting circuit is further configured to add the zero padding bits to the received data block at a center index of bits in the rows in the received data block.

5. A circuit for forward error correction decoding, comprising:
  a decoding pipeline including a plurality of decoding stages, each decoding stage configured to receive blocks of data symbols and FEC datagrams in an interleaved format, each of a first set of the FEC datagrams corresponding to a respective row of the data symbols in a de-interleaved format and each of a second set of the FEC datagrams corresponding to a respective column of the data symbols in the de-interleaved format, each decoding stage including:
    a first formatting circuit configured to format the data symbols in the interleaved format into a row-aligned format, wherein each row of the data symbols in the row-aligned format includes symbols equal to symbols in a corresponding row in the de-interleaved format;
    a row decoding circuit coupled to the first formatting circuit and configured to perform FEC decoding of the data symbols in the row-aligned format using the first set of FEC datagrams;
    a second formatting circuit coupled to the row decoding circuit and configured to format the data symbols in the row-aligned format into a column-aligned format, wherein each row of the data symbols in the column-aligned format includes symbols equal to symbols in a corresponding column in the de-interleaved format;
    a column decoding circuit coupled to the second formatting circuit and configured to perform FEC decoding of the data symbols in the column-aligned format using the second set of FEC datagrams; and
    a third formatting circuit coupled to the column decoding circuit and configured to format the data symbols in the column-aligned format into the interleaved format.

6. The circuit of claim 5, wherein:
  the blocks of data symbols and FEC datagrams in the interleaved format include L columns of the symbols and FEC datagrams;
  the decoding stage is configured to receive columns of the blocks of data symbols in the interleaved format in parallel with symbols of each column being received sequentially at a respective one of L 1-bit inputs of the decoding stage;
  the first formatting circuit is connected to the L 1-bit inputs and configured to format the data symbols in the interleaved format into the row-aligned format by delaying symbols received on (L−1)/2 leftmost bits of the L 1-bit inputs to align the data symbols into rows corresponding to respective rows of the de-interleaved format;
  the second formatting circuit is configured to format the data symbols in the row-aligned format into the column-aligned format by delaying symbols in the row-aligned format, received on L bits output from the row decoding circuit, to align the data symbols into rows corresponding to the respective columns of the de-interleaved format; and
  the third formatting circuit is configured to format the data symbols in the column-aligned format into the interleaved format by delaying symbols in the column-aligned format, received on L bits output from the row decoding circuit, to place the data symbols into the interleaved format.

7. The circuit of claim 6, wherein the delaying of symbols received on (L−1)/2 leftmost bits of the L 1-bit inputs delay each of the (L−1)/2 leftmost bits by a respective number of delay units Y, where Y is an absolute value of the difference between an index of the respective leftmost bit and an index of a center bit (L+1)/2 and each delay unit includes a number of inputs cycles equal to the number of bits in one of the symbols.

8. The circuit of claim 6, wherein the delaying of symbols in the row-aligned format to align the data symbols into rows corresponding to the respective columns of the de-interleaved format delay each of the L bits by a respective number of delay units equal to an index of the respective bit in the L bits, where each delay unit includes a number of inputs cycles equal to the number of bits in one of the symbols.

9. The circuit of claim 6, wherein the delaying of symbols in the column-aligned format to place the data symbols in the interleaved format delay each of the (L+1)/2 leftmost bits by (L−1)/2 delay units, and delay each of the (L−1)/2 rightmost bits by a respective number of delay units equal to L−M, where M is an index of the respective bit in the L bits and each delay unit includes a number of inputs cycles equal to the number of bits in one of the symbols.

10. The circuit of claim 5, wherein:
  in a first one of the plurality of decoding stages in the decoding pipeline, the first formatting circuit is further configured to add a plurality of symbols including zero padding bits to the data symbols in the interleaved format into a row-aligned format; and
  in a last one of the plurality of decoding stages in the decoding pipeline, the third formatting circuit is further configured to remove the plurality of symbols that include the zero padding bits from the data symbols in the interleaved format.

11. A method for forward error correction (FEC) encoding, comprising:
  receiving a first plurality of data symbols;
  adding a second plurality of symbols including zero padding bits to the first plurality of data symbols to form a data block;
  formatting the data block into a de-interleaved format;
  determining a first set of FEC datagrams including a respective datagram for each row of symbols of the data block in the de-interleaved format;
  determining a second set of FEC datagrams including a respective datagram for each column of symbols of the data block in the de-interleaved format;
  adding the first and second sets of FEC datagrams to the data block in the de-interleaved format to produce an FEC coded data block;
  removing the second plurality of symbols including the zero padding bits from the FEC coded data block to produce a reduced size FEC coded data block; and
  formatting the reduced size FEC coded data block into an interleaved format.

12. The method of claim 11, wherein a ratio of data bits to parity bits in the FEC coded data block is 956 to 64.

13. The method of claim 12, wherein a ratio of data bits to zero padding bits in the FEC coded data block is 956 to 3.

14. The method of claim 11, further comprising:
  transmitting the data block in the interleaved format to a decoder circuit; and
  using the decoder circuit:
    adding a third plurality of symbols including zero padding bits to the data block in the interleaved format;
    formatting the data block in the interleaved format into a row-aligned format, wherein each row of the symbols in the row-aligned format includes symbols equal to symbols in a corresponding row in the de-interleaved format;

performing FEC decoding of the data block in the row-aligned format using the first set of FEC datagrams;

formatting the data block in the row-aligned format into a column-aligned format, wherein each row of the symbols in the column-aligned format includes symbols equal to symbols in a corresponding column in the de-interleaved format;

performing FEC decoding on the data block in the column-aligned format using the second set of FEC datagrams;

formatting the data block in the column-aligned format into the interleaved format; and removing the third plurality of symbols including the zero padding bits from the data block in the interleaved format.

15. The method of claim 14, further comprising, at the decoder circuit and prior to the removing of the third plurality of symbols including the zero padding bits from the data block in the interleaved format:

formatting the data block in the interleaved format into a row-aligned format;

performing FEC decoding of the data block in the row-aligned format using the first set of FEC datagrams;

formatting the data block in the row-aligned format into a column-aligned format;

performing FEC decoding on the data block in the column-aligned format using the second set of FEC datagrams; and formatting the data block in the column-aligned format into the interleaved format.

16. The method of claim 14, wherein:

the formatting of the data block in the interleaved format into the row-aligned format includes shifting columns of the data block in the interleaved format to align the symbols of the data block into rows of symbols corresponding to respective rows in the de-interleaved format; and the formatting of the data block in the row-aligned format into the column-aligned format includes shifting columns of the data block in the row-aligned format to align symbols of the data block into rows of symbols corresponding to respective columns in the de-interleaved format.

17. The method of claim 16, wherein:

the data block in the interleaved format includes X rightmost columns, a center column, and X leftmost columns, where X>1; and the shifting columns of the data block in the interleaved format to align the symbols of the data block into rows of symbols corresponding to respective rows in the de-interleaved format includes shifting each of the X leftmost columns of data symbols in the interleaved format by a respective number of rows Y, where Y is an absolute value of a difference between an index of the respective leftmost column and an index of the center column.

18. The method of claim 16, wherein the shifting columns of the data symbols in the row-aligned format to align the symbols of the data block into rows of symbols corresponding to respective columns in the de-interleaved format includes:

shifting each of the X leftmost columns of the data block in the interleaved format by a respective number of rows −Y, where Y is an absolute value of the difference between an index of the respective leftmost column and an index of the center column; and shifting each of the X rightmost columns of data symbols in the interleaved format by a respective number of rows Y, where Y is the absolute difference between an index of the respective rightmost column and an index of the center column.

19. The method of claim 16, wherein the shifting columns of the data block in the column-aligned format to place the data symbols in the interleaved format includes:

shifting each of the X rightmost columns of data symbols in the interleaved format by a respective number of rows −Y, where Y is an absolute value of the difference between an index of the respective rightmost column and an index of the center column.

* * * * *